United States Patent
Mochizuki

[11] Patent Number: 5,886,574
[45] Date of Patent: Mar. 23, 1999

[54] HIGH-FREQUENCY AMPLIFIER

[75] Inventor: Takuji Mochizuki, Tokyo, Japan

[73] Assignee: NEC Corporation, Tokyo, Japan

[21] Appl. No.: 956,785

[22] Filed: Oct. 23, 1997

[30]    Foreign Application Priority Data

Oct. 29, 1996  [JP]  Japan ..................................... 8-286963

[51] Int. Cl.[6] ................. H03F 1/00; H03F 3/60
[52] U.S. Cl. ............................. 330/66; 330/286
[58] Field of Search .................. 330/65, 66, 67, 330/68, 286, 302; 333/246, 247; 257/275, 728

[56]              References Cited

U.S. PATENT DOCUMENTS 4,965,526  10/1990  Craft et al. ................................ 330/66
5,357,212  10/1994  Kohno ..................................... 330/286

FOREIGN PATENT DOCUMENTS 0 387 955   9/1990  European Pat. Off. .
33 19 943  12/1984  Germany .
62-21618    2/1987  Japan .
63-220606   9/1988  Japan .

*Primary Examiner*—Robert Pascal
*Assistant Examiner*—Paricia Nguyen

*Attorney, Agent, or Firm*—Young & Thompson

[57]             ABSTRACT

A high-frequency amplifier has a transistor having a transistor input terminal, a transistor output terminal, and ground radiation fins, a first dielectric board having a transistor input matching circuit, and a second dielectric board having a transistor output matching circuit. The transistor is mounted by bringing the ground radiation fins into tight contact with a common ground surface member. The first and second dielectric boards being mounted on the common ground surface member. The first and second dielectric boards are respectively formed with first and second ground conductors on common ground surface member sides thereof. The transistor input terminal and the transistor input matching circuit are connected to each other and so are the transistor output terminal and the transistor output matching circuit. A thin film conductive sheet is continuously inserted to extend from the gap between the first ground conductor and the common ground surface member to the gap between the second ground conductor and the common ground surface member through the gap between the first ground conductor and the common ground surface member. The first dielectric board, the ground radiation fins, and the second dielectric boards are in tight contact with the common ground surface member via the thin film conductive sheet so that the thin film conductive sheet is pressed and fixed between the first and second dielectric boards and the radiation fins, and the common ground surface member.

5 Claims, 8 Drawing Sheets

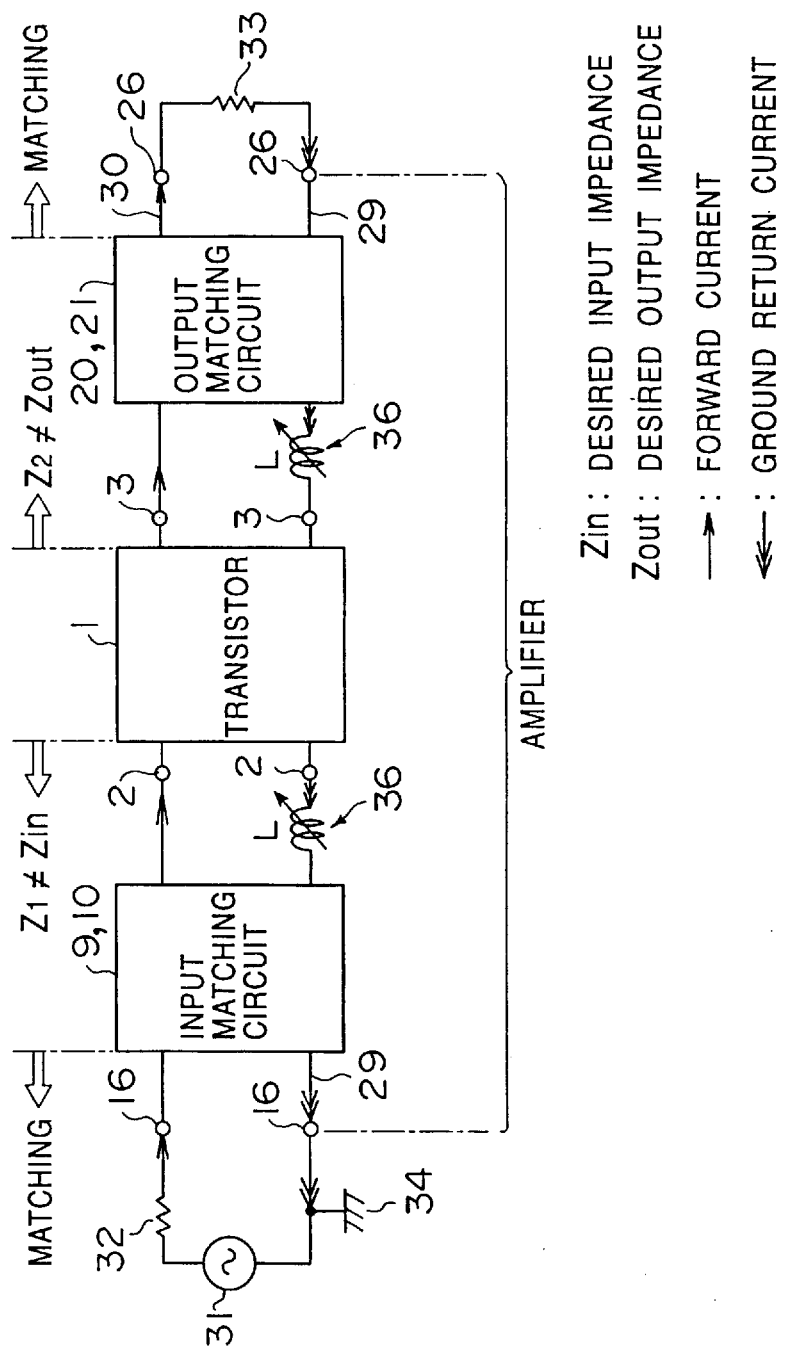

HIGH-FREQUENCY AMPLIFIER

BACKGROUND OF THE INVENTION

1. Field of the Invention

The present invention relates to a high-frequency amplifier in which discrete transistor input/output terminals, with which radiation fins having a function of an electric ground terminal come into tight contact, and matching microstrip lines on the input/output dielectric boards are connected to each other and, more particularly, to circuit mounting which aims at removing unstable factors in the amplifier characteristics caused by the parasitic inductance produced on the high-frequency ground line due to high-frequency discontinuity of the ground surface near the transistor input/output terminals.

2. Description of the Prior Art

As an example of the high-frequency amplifier of this type, for example, a high-frequency power amplifier described in Japanese Unexamined Utility Model Publication No. 62-21618 is known. A conventional high-frequency amplifier (which will be referred to as the first conventional technique) will be described with reference to FIG. 1A. In the example shown in FIG. 1A, 50-Ω microstrip lines 9 and 21, and an input matching stab 46 and an output matching stab 20, are formed on a dielectric board 37. The microstrip lines 9 and 21, and the input matching stab 46 and output matching stab 20, are used as matching circuits. Holes are formed in the dielectric board 37, having two surfaces covered with copper thin films, around the mounting portion of a transistor 1, and the dielectric board 37 is attached on a common ground surface member 27 with attaching screws 28. The transistor 1 having radiation fins 4 is attached to the common ground surface member 27 with the attaching screws 28 through the holes described above. A transistor input terminal 2 and the input matching stab 46, and a transistor output terminal 3 and the output matching stab 20, are connected to each other by soldering.

As shown in FIG. 1A, the transistor 1 is formed with a plurality of via holes 39, and has ground patterns 11 and transistor emitter ground terminals 45. Voltage-cutting chip capacitors 15 and 25 are respectively arranged on the microstrip lines 9 and 21.

As another conventional high-frequency amplifier, one shown in FIG. 1B is also known (this will be referred to as the second conventional technique). In the example shown in FIG. 1B, the constituent elements identical to those in the example shown in FIG. 1A will be denoted by the same reference numerals as in FIG. 1A. In the second conventional technique, the high-frequency amplifier has first and second dielectric boards 6 and 17 each of which has two surfaces covered with copper thin films. A microstrip line 9 and an input matching stab 46 are formed on the first dielectric board 6, and a microstrip line 21 and an output matching stab 20 are formed on the second dielectric board 17. The first and second dielectric boards 6 and 17 are separately mounted on a common ground surface member 27 with a transistor 1 interposed between them. A transistor input terminal 2 and a transistor output terminal 3 are connected to the input matching stab 46 and the output matching stab 20, respectively, by soldering.

In the first and second conventional techniques described above, major matching circuits each using a distributed or concentrated constant must be arranged on the board immediately near the transistor input and output terminals 2 and 3 in order to achieve various types of matching states with the transistor 1. Usually, to bring the ground conductors on the lower surfaces of the dielectric boards 6 and 17 or the ground conductor on the dielectric board 37 into tight contact with the common ground surface member 27, screw fastening is employed, as described above. Hence, the screws 28 cannot but be arranged to avoid the input matching stab 46 and output matching stab 20 immediately near the transistor input and output terminals 2 and 3.

The positions of the screws are inevitably separated from the transistor input and output terminals 2 and 3. Accordingly, as shown in FIG. 2, contact aiming at achieving electrical ground between lower-surface ground conductors 19a and 19b located on the board end faces immediately under the transistor input and output terminals 2 and 3, respectively, and the common ground surface member 27 becomes poor (this contact is indicated as contact points 35a and 35b in FIG. 2).

In addition, also because of surface treatment (solder coating, solder plating, and the like) of the lower surface of the board and the surface microstructure of the common ground surface, not only discontinuity and uncertainty occur in the electrical ground state at the board discontinuous portion, but also unstable contact is caused by a temperature change.

When such unstable contact occurs, as shown in FIG. 2, a high-frequency ground return current 29 flows along a route longer than a forward current 30 because of the discontinuity of the ground line near the lower surfaces 19a and 19b of the transistor input/output connecting portions, and a reverse ground return current 29' occurs at the ground point 35a. When this is expressed by an equivalent two-terminal twin circuit, as shown in FIG. 3, parasitic inductances 36 are produced on the ground return lines immediately near the transistor input and output terminals 2 and 3 that are significant portions in the matching conditions. The inductance itself of each of the parasitic inductances 36 behaves unstably due to a temperature change and unstable contact (uncertainty of the contact points 35a and 35b in FIG. 2) during assembly, thereby changing the matching state. A change in matching state then brings about variations in frequency and temperature characteristics of gain, power, and noise, non-reproducibility of various characteristics, and unwanted oscillation in the amplifier. Referring to FIGS. 2 and 3, reference numeral 31 denotes a signal source; 32 and 33, 50-Ω input and output loads, respectively; and 34, ground.

As in the second conventional technique, emitter ground terminals 45 at the two ends of the signal input and terminals 2 and 3 of the discrete transistor 1 are sometimes directly connected to the lower-surface conductor of the second dielectric board 17 by soldering. For this purpose, the transistor 1 and the dielectric board 17 must be temporarily assembled. This temporary assembly is not conveniently performed. Since the common ground surface member 27 avoids the soldering portions of the transistor emitter ground terminals 45 on the lower surface of the dielectric board 17, a complicated structure results.

Depending on the shape of the transistor package, the ground return route cannot be minimized as a secondary effect of this method. Hence, the versatility lacks.

As described above, in the conventional high-frequency amplifier, when obtaining matching of a discrete transistor, although the major matching circuits must be arranged immediately near the transistor input/output connecting portions, the positions of screws necessary for mounting cannot but be inevitably set remote from the input/output connecting portions. As a result, ground of the lower surfaces of the input/output matching circuit portions that highly need ground becomes poor (weak), making the matching state unstable.

More specifically, in the conventional high-frequency amplifier, when bringing the lower-surface ground conductor of a microstrip board (dielectric board), where the discrete transistor input/output matching circuits are arranged, into tight contact with the common ground surface, screw fastening is employed. Electrical ground between the common ground surface and the board lower-surface ground conductors immediately under the input/output connecting portions that are significant for matching becomes discontinuous and unstable, and the various characteristics of the amplifier become unstable.

In addition, in the conventional high-frequency amplifier, since a transistor having a package with a special shape and terminals arranged in a special manner is used, continuity of ground at the matching portion is attained by directly soldering the emitter ground terminal to the ground conductor on the lower surface of the matching board. However, such an amplifier cannot be assembled easily and has a complicated mechanism, as described above.

SUMMARY OF THE INVENTION

The present invention has been made in view of the above situation of the conventional technique, and has as its object to provide a high-frequency amplifier having stable and good characteristics and performance.

It is another object of the present invention to provide a high-frequency amplifier in which a change in characteristics caused by a temperature and variations caused by assembly can be minimized.

It is still another object of the present invention to provide a highly reliable high-frequency amplifier.

In order to achieve the above objects, according to the first aspect of the present invention, there is provided, in an amplifier comprising a transistor having a transistor input terminal, a transistor output terminal, and ground radiation fins, a first dielectric board having a transistor input matching circuit, and a second dielectric board having a transistor output matching circuit, the transistor being mounted by bringing the ground radiation fins into tight contact with a common ground surface member, the first and second dielectric boards being mounted on the common ground surface member, the first and second dielectric boards being respectively formed with first and second ground conductors on common ground surface member sides thereof, and the transistor input terminal and the transistor input matching circuit being connected to each other and the transistor output terminal and the transistor output matching circuit being connected to each other, a high-frequency amplifier wherein a thin film conductive sheet is continuously inserted to extend from a gap between the first ground conductor and the common ground surface member to a gap between the second ground conductor and the common ground surface member through a gap between the first ground conductor and the common ground surface member, and the first dielectric board, the ground radiation fins, and the second dielectric boards are brought into tight contact with the common ground surface member via the thin film conductive sheet so as to press and fix the thin film conductive sheet between the first and second dielectric boards and the radiation fins, and the common ground surface member.

According to the second aspect of the present invention, in the high-frequency amplifier described in the first aspect, there is provided a high-frequency amplifier wherein the transistor is an emitter- or base-grounded discrete bipolar transistor.

According to the third aspect of the present invention, in the high-frequency amplifier described in the first aspect, there is provided a high-frequency amplifier wherein the transistor is a source-grounded discrete field effect transistor.

According to the fourth aspect of the present invention, in the high-frequency amplifier described in any of the first to third aspects, there is provided a high-frequency amplifier wherein the first and second dielectric boards are integrally connected to each other.

According to the fifth aspect of the present invention, in the high-frequency amplifier described in any of the first to fourth aspects, there is provided a high-frequency amplifier wherein the transistor input matching circuit and the transistor output matching circuit respectively have microstrip lines.

As is apparent from the aspects described above, according to the present invention, one continuous thin film conductive sheet is inserted to extend from the gap between a solder coating film serving as the lower-surface ground conductor of the first dielectric board and the common ground surface member to the gap between a solder coating film serving as the lower-surface ground conductor of the second dielectric board and the common ground surface member, through the gap between the lower surfaces of the transistor ground radiation fins and the common ground surface member, and thereafter the first dielectric board, the transistor radiation fins, and the second dielectric boards are brought into tight contact with the upper surface of the common ground surface member by using screws, so that the sheet is pressed and fixed between the first and second dielectric boards and the radiation fins, and the common ground surface member. The gap between the lower-surface ground end of the input matching circuit and the common ground surface member, and the gap between the lower-surface ground end of the output matching circuit and the common ground surface member can be filled with the pressed conductive sheet. As a result, even if the positions of the board attaching screws are remote from portions near the input/output matching circuits, common ground of the lower-surface ground conductor of the first dielectric board, transistor ground surface, and lower-surface ground conductor of the second dielectric board is ensured, and no unwanted parasitic inductance is produced on the ground current return line. As a result, the matching state of the amplifier can be stably maintained regardless of the assembly state or a mechanical change due to a temperature change.

More specifically, according to the present invention, in an amplifier in which a discrete transistor, the radiation fins of which also serve as ground, and input/output matching boards (the first input matching dielectric board and the second output matching dielectric board) are respectively mounted on a common ground surface member, high-frequency ground between the transistor and the input/output matching circuits is connected through a reliable, stable, and continuous shortest line in accordance with a simple method. As a result, a stable amplifier which has good reproducibility, in which the transistor input/output matching state is optimized and the maximum state of the characteristics of the transistor is maintained, and which is free from abnormal variations in the temperature and frequency characteristics of, e.g., the gain, power, noise, distortion, efficiency, and the like of the amplifier, and is also prone to unwanted oscillation, can be obtained.

Variations in various characteristics of the amplifiers that occur in the manufacture on a mass production base are suppressed, the productivity is improved, and the reproducibility is ensured, leading to high reliability.

According to the present invention, in order to ensure the continuity of the ground surface, the ground continuity is realized by adding only one thin film conductive sheet without employing a transistor and the like having a special package shape or a special terminal arrangement. Accordingly, the present invention is excellent in mass production in terms of mechanical simplicity, easiness in assembly, low cost, and the like.

More specifically, according to the present invention, as far as the radiation fins have a function as the ground terminal and are directly mounted on the surface of the common ground housing, versatile mounting can be attained easily and at a low cost, regardless of the package shape or terminal arrangement of the discrete transistor, the module, or the like, because stable operation of the amplifier can be guaranteed.

According to the present invention, a thin film conductive sheet is inserted and fixed by pressing between the ground conductor surface on the lower surface of the board and the ground surfaces of the transistor radiation fins, and the common ground surface. The surface microstructure of the lower surface of the board and of the lower surfaces of the transistor radiation fins can be absorbed only by the thickness of the thin film conductive sheet so that the continuity of the ground surface, which is required for stabilization of the device characteristics, is ensured. The pressure produced upon fastening the screws acts as a surface pressure that contributes to pressure connection of the ground surface. As a result, the count of fastening screws can be reduced.

In other words, according to the present invention, when attaching the input/output boards on the common ground housing surface, the positions of the attaching screws are optimized, so that the count of screws used for board attachment can be reduced while ensuring stabilization of the device characteristics. As a result, the cost of material of the screws, the cost required for forming taps on the housing, the cost of forming holes in the boards, and the count of assembly steps required by screw fastening can be reduced. The cost of the amplifier, the panel, and the apparatus including them can accordingly be reduced.

The above and many other objects, features and advantages of the present invention will become manifest to those skilled in the art upon making reference to the following detailed description and accompanying drawings in which preferred embodiments incorporating the principles of the present invention are shown by way of illustrative example.

BRIEF DESCRIPTION OF THE DRAWINGS

FIG. 3 is a diagram of an equivalent two-terminal twin circuit in the conventional high-frequency amplifier;

FIGS. 7A to 7D are graphs showing the input/output characteristics and output level frequency characteristics in the first embodiment shown in FIGS. 4A and 4B in comparison with those of the conventional high-frequency amplifier, in which FIG. 7A shows the input/output characteristics of the first embodiment of the present invention, FIG. 7B shows the input/output characteristics of the conventional high-frequency amplifier, FIG. 7C shows the output level frequency characteristics of the first embodiment of the present invention, and FIG. 7E shows the output level frequency characteristics of the conventional high-frequency amplifier.

DETAILED DESCRIPTION OF PREFERRED EMBODIMENTS

Figure 1A:
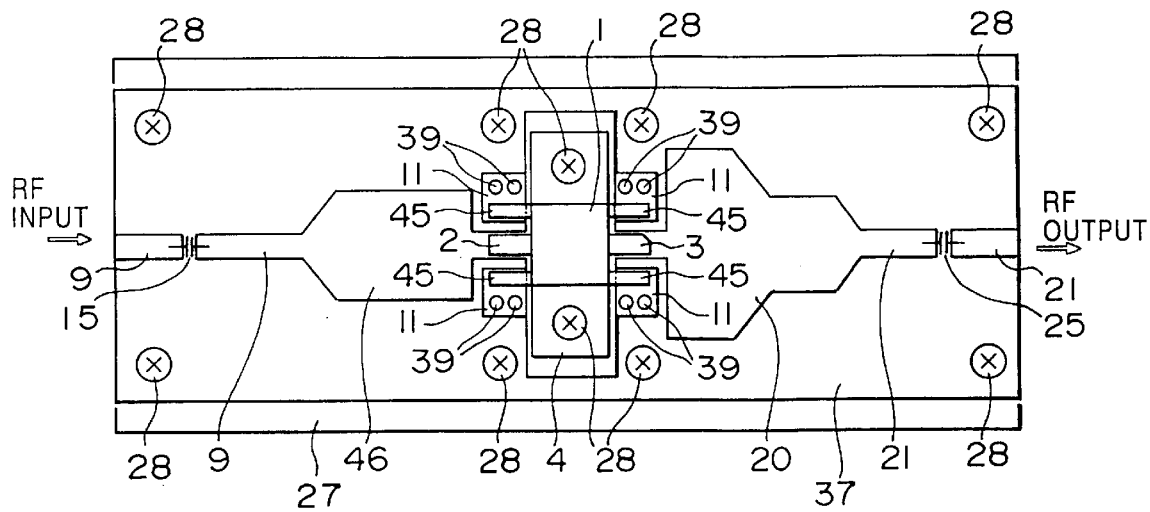
FIGS. 1A and 1B are schematic plan views for respectively explaining conventional high-frequency amplifiers.
Figure 1B:
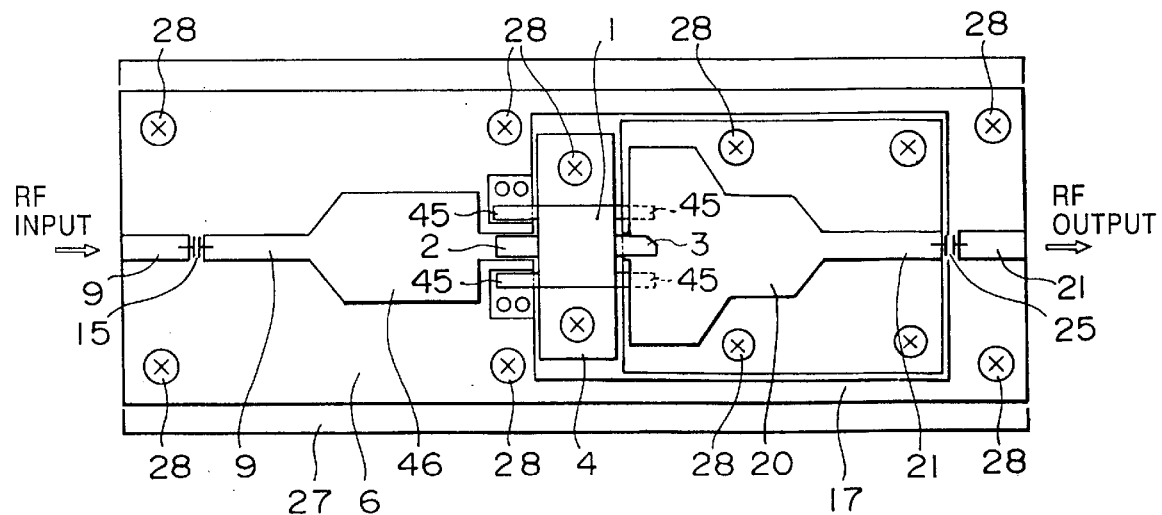
Figure 2:
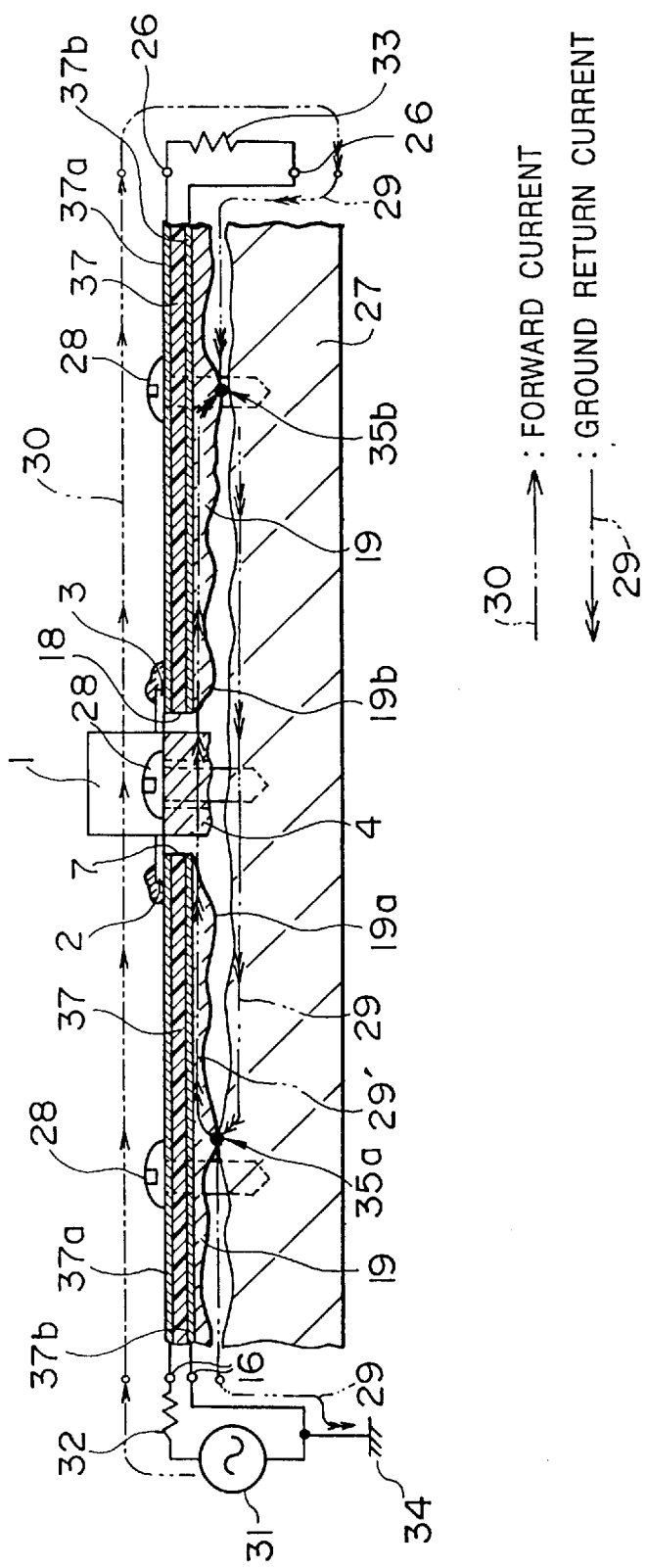
FIG. 2 is a longitudinal sectional view of the conventional high-frequency amplifier shown in FIG. 1A.

Several preferred embodiments of the present invention will be described with reference to the accompanying drawings.

The first embodiment of the present invention will be described with reference to FIGS. 4A and 4B. As will be described later, radiation fins 4 having a function of an electrical ground terminal for a discrete transistor 1 shown in FIGS. 4A and 4B can be mounted on a common ground surface member 27 in tight contact with it. A transistor input matching circuit including a microstrip arrangement is formed on a first dielectric board 6 having two surfaces respectively formed with copper films 6a and 6b. The first dielectric board 6 is mounted on the common ground surface member 27. In other words, a 50-Ω microstrip line 9 and input matching chip capacitors 10 are formed on the first dielectric board 6. Similarly, a transistor output matching circuit including a microstrip arrangement is formed on a second dielectric board 17 having two surfaces respectively formed with copper films 17a and 17b. The second dielectric board 17 is mounted on the common ground surface member 27. In other words, an output matching stab 20 and a 50-Ω microstrip line 21 are formed on the second dielectric board 17.

A transistor input terminal 2 and a transistor output terminal 3 are respectively connected to the microstrip line 9 and output matching stab 20, thus constituting an amplifier.

Figures 4A, 4B:
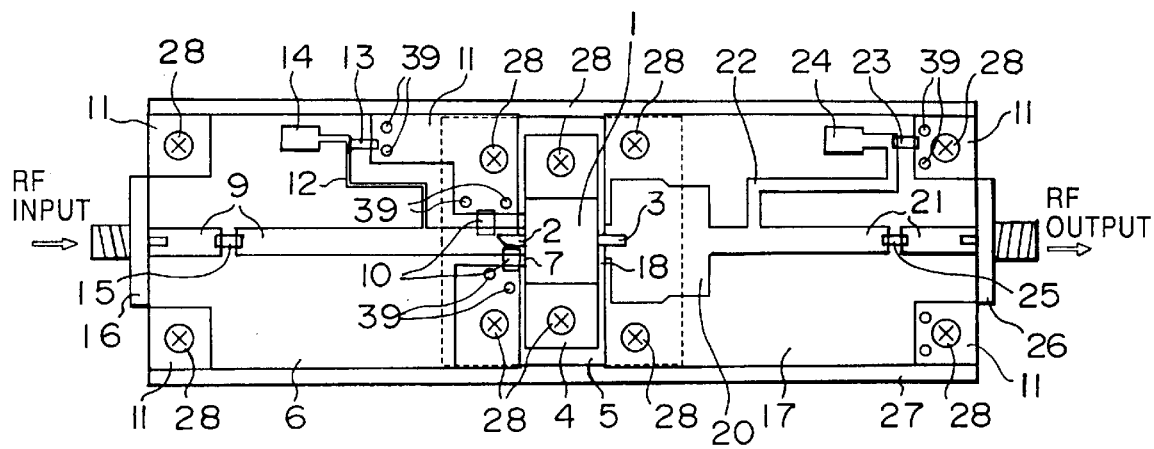
FIGS. 4A and 4B are a schematic plan view and an exploded view, respectively, showing the first embodiment of the present invention.

As shown in FIGS. 4A and 4B, one thin film conductive sheet 5 is continuously inserted to extend from the gap between the lower surface of a lower-surface ground conductor 19 of the first dielectric board 6 and an upper surface 27a of the common ground surface member 27 to the gap between the lower surface of a lower-surface ground conductor 19, made of a solder coating film, of the second dielectric board 17 and the upper surface 27a of the common ground surface member 27, through the gap between the lower surfaces of the transistor ground radiation fins 4 and the upper surface 27a of the common ground surface member 27. The first dielectric board 6, the radiation fins 4, and the second dielectric board 17 are fastened together on and brought into tight contact with the common ground surface member 27, together with the thin film conductive sheet 5 inserted as described above, with screws 28. In other words, the sheet 5 is pressed and fixed by the screws 28.

Figure 5:
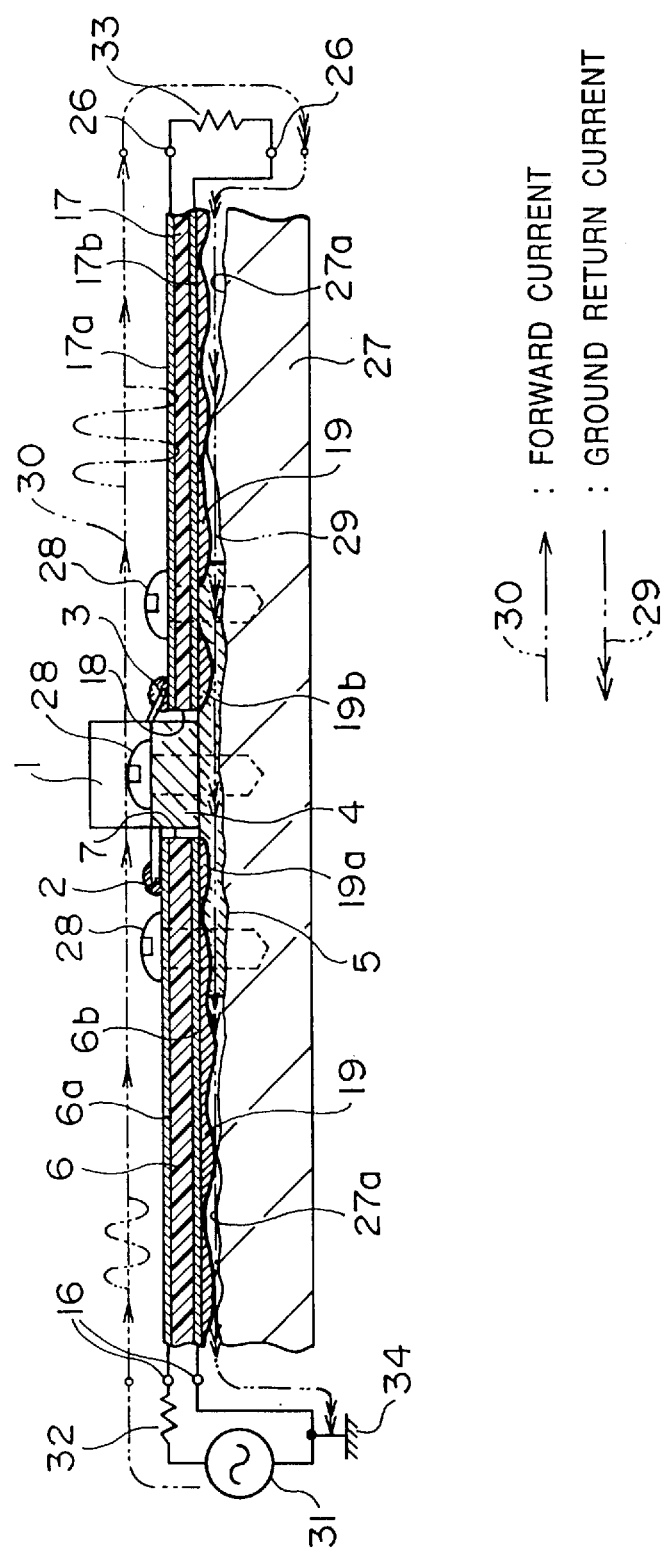
FIG. 5 is a sectional view for explaining the operation of the embodiment shown in FIGS. 4A and 4B.

Referring also to FIG. 5, a signal supplied from a dielectric board input terminal 16 flows through the microstrip line 9, a voltage-cutting chip capacitor 15, and the input-side matching circuits (input matching chip capacitors) 10, and is input to the transistor 1 through the connecting portion of the discrete transistor input terminal 2.

The signal (amplification signal) amplified by the transistor 1 is output from the connecting portion of the transistor output terminal 3 to an output terminal 26 through the output matching stab 20, microstrip line 21, and voltage-cutting capacitor 25 on the second dielectric board 17.

The input matching chip capacitors 10 and output matching stab 20 (both the input matching chip capacitor and the output matching stab may also be called matching circuits) arranged near the input/output terminals of the transistor 1 are constituted by distributed or concentrated parameter circuits in order to perform gain matching, power matching, efficiency matching, distortion matching, noise matching, and the like of the microstrip lines 9 and 21 usually having a 50-Ω characteristic impedance. The matching circuits 10 and 20 together act to obtain required characteristics.

The lower surfaces of the first and second dielectric boards 6 and 17 entirely form ground conductor surfaces with the solder coating film 19 to include the lower surfaces of the input matching circuits 10 and output matching circuit 20, respectively, and are pressed against and screwed on the thin film conductive sheet 5, so that the thin film conductive sheet 5 and the board lower-surface conductor surfaces of the first and second dielectric boards 6 and 17 are electrically grounded. Since the transistor 1 is screwed (commonly fastened) on the common ground surface member 27 of the radiation fins 4 through the thin film conductive sheet 5, it is electrically grounded between the radiation fins 4 and thin film conductive sheet 5. In other words, electrical ground between the lower-surface ground portions 19a and 19b of the transistor input and output portions of the first and second dielectric boards 6 and 17, and the transistor 1, is connected with a shortest route through one inserted thin film conductive sheet 5 without discontinuity.

Electrical contact between the thin film conductive sheet 5 and the respective ground surfaces will be described. When a soft conductive material having an appropriate thickness is used as the material of the thin film conductive sheet 5, even if the screw positions are remote from the transistor input and output matching circuits 10 and 20, since the thin film conductive sheet 5 is pressed, the thickness of the thin film conductive sheet 5 absorbs the surface microstructure of the lower-surface ground conductors 19a and 19b, including the surface treatment, located at board end faces (a first board output end and a second board output end) 7 and 18, the board deflection that occurs during screw fastening, and the surface microstructure of the ground lower surfaces of the transistor radiation fins 4. As a result, even if the common ground surface member 27 has certain surface, substantially reliable electrical ground can be ensured with the thin film conductive sheet 5 continuously from the first dielectric board 6 to the second dielectric board 17 through the transistor 1.

With the arrangement as described above, as shown in FIG. 5, a high-frequency ground return current 29 flows along the shortest and continuous link on the ground route near the first board output end 7 and second board input end 18. In an equivalent two-terminal twin expression as in the conventional case, no load of parasitic inductances 36 acts on the ground return immediately near the first board output end 7 and second board input end 18. The parasitic inductances 36 do not behave unstably due to a temperature change and unstable contact during assembly, and stable and optimum input/output matching states can always be obtained.

Accordingly, a stable amplification state with good reproducibility free from abnormal variations in the temperature and frequency characteristics of, e.g., the gain, power, noise, distortion, efficiency, and the like of the amplifier, and is robust against unwanted oscillation, can be obtained.

A practical example of the high-frequency amplifier according to the present invention will be described with reference to FIGS. 4A and 4B again. The amplifier was an S-band (2,660- to 2,690-MHz band) high-output amplifier. As a first dielectric board 6, a 1.6-mm thick glass-reinforced epoxy board having a relative dielectric constant q=4.8 and a dielectric loss tangent tanδ=0.0167 was used. A 2-mm width microstrip line 9 having a characteristic impedance of 50 Ω was formed on the first dielectric board 6 to extend from a 50-Ω impedance input terminal 16, and 0.5-pF and 1-pF chip capacitors 10 for input gain matching of a transistor 1 were mounted as the matching circuits on conductive patterns 11. Via holes 39 are formed in the ground patterns 11 to connect them to the lower-surface ground conductors.

As the transistor 1, a discrete GaAs high-output field effect transistor, which serves as a high-output amplification element and in which radiation fins 4 with screw holes also serve as source ground, is used. Accordingly, a (transistor gate) input terminal 2 is connected to the first dielectric board 6 by soldering. A λ/4 line 12 having a width of 0.18 mm and a band frequency of 2.6 GHz is connected to one end of the 50-Ω microstrip line 9 on the first dielectric board 6, and a 1,000-pF chip capacitor 13 is connected to the other end of the microstrip line 9 to form an RF short-circuit. As a result, a bias feed line which appears RF open from the 50-Ω microstrip line 9 is formed to supply a gate bias.

Reference numeral 14 denotes a point where a gate load voltage is applied externally. A 10-pF voltage-cutting chip capacitor 15 is inserted in the microstrip line 9 in series so that the applied gate load voltage will not act on the input-side external circuit.

A (transistor drain) output terminal 3 is connected to a second dielectric board 17 by soldering, and the transistor radiation fins 4 are grounded as the source.

As the second dielectric board 17, a low-loss Teflon/glass fiber board having a low dielectric loss tangent (tanδ= 0.0058) is used in order to guide the signal from an output-power matching circuit (output matching stab) 20 to an output terminal 26 without decreasing the output power. The first dielectric board 6 has a dielectric tangent loss of 0.03 dB/cm, and the second dielectric board 17 0.01 dB/cm.

The second dielectric board 17 has a relative dielectric constant $\epsilon_r$ of 2.55, and a thickness of 0.8 mm. The matching circuit 20 for transistor output power matching is realized on the second dielectric board 17 by the distributed constant open stab. After matching to a characteristic impedance of 50 Ω is performed, the transistor output is guided to the output terminal 26 by using the 50-Ω microstrip line 21 having a width of 2 mm.

Similarly to the first dielectric board 6, a λ/4 line 22 having a width of 1 mm and a frequency of 2.6 GHz is connected to one end of the 50-Ω microstrip line 21 on the second dielectric board 17, and a 1,000-pF chip capacitor 23 is connected to the other end thereof to form an RF short-circuit. As a result, a bias feed line which appears RF open from the 50-Ω microstrip line 21 is constituted to supply a drain bias. Reference numeral 24 denotes a point where a drain positive voltage is applied externally. A 10-pF voltage-cutting chip capacitor 25 is inserted in the microstrip line 21 in series so that the applied drain positive voltage does not act on the output-side external circuit.

One continuous thin film conductive sheet 5, having a size of 2 cm×2 cm and a thickness of 0.4 mm, is inserted to extend from the gap between a ground conductor 19a formed by surface-treating a copper film 6b with a solder coating film 19 on the lower surface of an end face (first board output end) 7 of the first dielectric board 6 close to the transistor input connecting portion, and an upper surface 27a of a cast aluminum mounting housing used as a common ground surface member 27, to the gap between a ground conductor 19b similarly formed by surface-treating a copper film 17b on the lower surface of an end face (second board input end) 18 of the second dielectric board 17 close to the transistor output connecting portion, and the upper surface 27a of the aluminum housing 27, through the gap between the lower surfaces of transistor source ground radiation fins 4, formed by plating gold on the copper surface, and the upper surface 27a of the cast aluminum housing 27. Thereafter, the thin film conductive sheet 5 is fastened together on the aluminum housing 27 to come into tight contact with it by using attaching screw holes formed in the first dielectric board 6, transistor radiation fins 4, and second dielectric board 17 with 2.3-mm diameter screws 28.

Both the first dielectric board 6 and second dielectric board 17 have a size of 3 cm×2 cm, and the outer shape of the transistor 1 is 6 mm×17 mm square. The gap between the output and input ends 7 and 18, and the transistor 1 is 0.3 mm at maximum.

Referring also to FIG. 5, when the first and second dielectric boards 6 and 17 are fastened with screws on the cast aluminum housing 27 through one inserted thin film conductive sheet 5 that is soft and conductive, and the transistor 1 is fastened with screws on the aluminum housing 27 through the thin film conductive sheet 5, as described above, the thin film conductive sheet 5 is tightly pressed, as described above.

Electrical ground between the transistor radiation fins 4 and the ground conductors 19a and 19b located on the lower surface near the transistor input and output matching circuits 10 and 20 of the first and second dielectric boards 6 and 17 is connected through one thin film conductive sheet 5 with a continuous, shortest route.

The screw positions on the board are remote from the surface transistor connecting portions because of the presence of the input and output matching circuits 10 and 20. However, regarding the electrical contact between the thin film conductive sheet 5 and the respective ground surfaces, the thickness (0.4 mm) of the thin film conductive sheet 5 and the softness during pressing absorb the surface microstructure of the ground conductors 19a and 19b of the lower surfaces of the respective boards and of the aluminum housing.

Considering the fact that the surface roughness of the first and second dielectric boards 6 and 17 resulting from lower-surface solder coating is usually 0.2 mm at maximum and that the flatness obtained when the upper surface of the cast aluminum housing is not particularly subjected to planarization is 0.6 mm at maximum, a process for filling the maximum gap of 0.8 mm is required.

If the fill ratio of the thin film conductive sheet 5 into the gaps described above in pressing is set to 50%, the point-contact state caused by the gaps between the mating surfaces is eliminated by inserting and pressing the thin film conductive sheet 5 having a thickness of 0.4 mm. Reliable electrical contact through surfaces can be achieved by the ground conductor 19 on the lower surface of the board and the thin film conductive sheet 5.

When the board deflection is considered, if the maximum allowable deflection at a position 2 cm from the board end in each transverse direction is set to 3%, the warp becomes 0.6 mm. When this board is pressed at a screw pitch of 13 mm, the pitch-to-pitch interval is reduced to be equal to or smaller than 0.4 mm at maximum. As a result, any gaps that may be formed by the warp can be sufficiently absorbed in the same manner by pressing a 0.4-mm thick solder sheet 5.

The surface roughness of the ground lower surfaces of the radiation fins 4 of the transistor 1 is originally as good as equal to or smaller than 50 $\mu$m, and the surface roughness of the upper surface 27a of the cast aluminum housing 27 is 0.6 mm at maximum. As a matter of course, the gap during mating is smaller than that between the first and second dielectric boards 6 and 17, and the cast aluminum housing 27. Upon insertion and pressing of the thin film conductive sheet 5 having a thickness of 0.4 mm, not only electrical contact between the lower surfaces of the transistor radiation fins 4 and the surface of the thin film conductive sheet 5, but also the thermal resistance from the transistor radiation fins 4 to the aluminum housing 27 can be suppressed low, so that a good radiation state can be maintained.

As described above, the continuity of electrical ground can be ensured through one thin film conductive sheet 5. As shown in FIG. 5, the high-frequency ground return current 29 flows along the shortest and continuous link, and no parasitic inductance occurs due to an unwanted ground return. Accordingly, stable and optimum high-output amplifier characteristics can be ensured.

In FIG. 5, reference numeral 31 denotes a signal source; 32 and 33, 50-$\Omega$ input and output loads, respectively; and 34, ground.

The input/output characteristics of the S-band (2,660-to 2,690-MHz band) high-output amplifier described above will be explained with reference to FIGS. 7A to 7D.

Figure 7A:
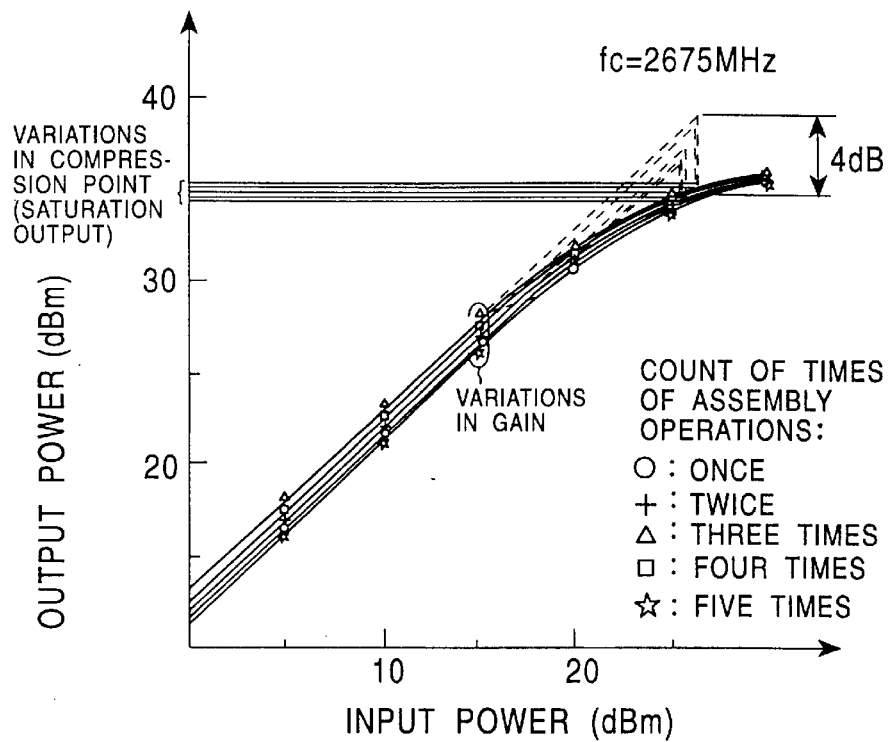
Figure 7B:
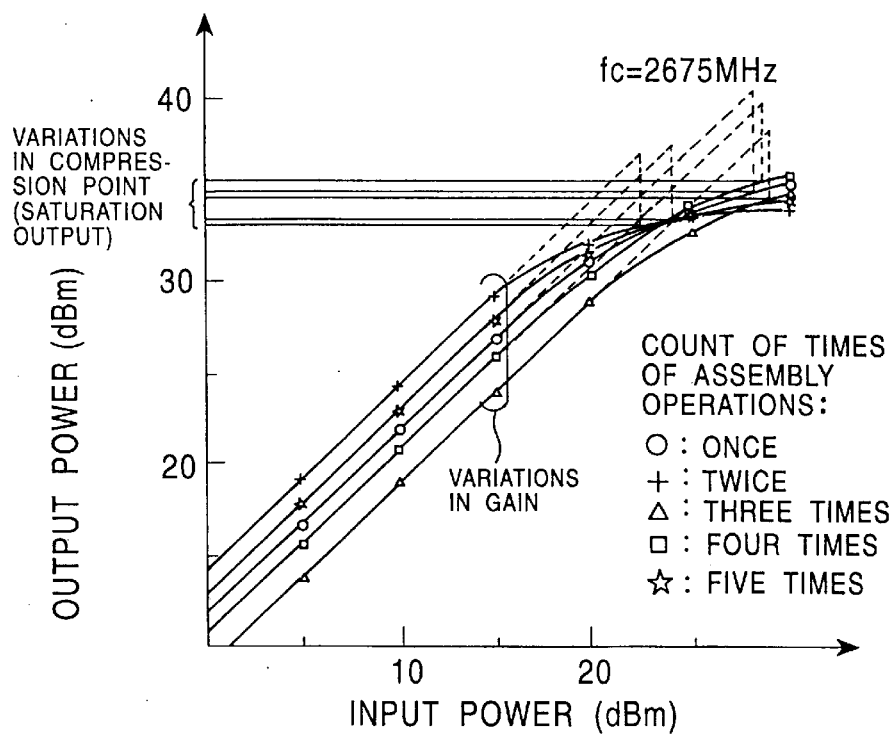

FIG. 7B shows a conventional case wherein no thin film conductive sheet 5 is inserted. Reassembly is performed five times for one amplifier. The input/output characteristics immediately after each assembly operation are measured at the center frequency of 2,675 MHz. Resultant variations are shown in FIG. 7B.

FIG. 7A shows the input/output characteristics obtained when assembly is performed five times for the amplifier according to the present invention. FIG. 7A shows that both the gain and saturation output (4-dB compression point) converge to stable values with better reproducibility than that in the conventional case, regardless of assembly. Therefore, the present invention is very effective as an arrangement for an amplifier that must be manufactured on a mass production base.

Figure 7C:
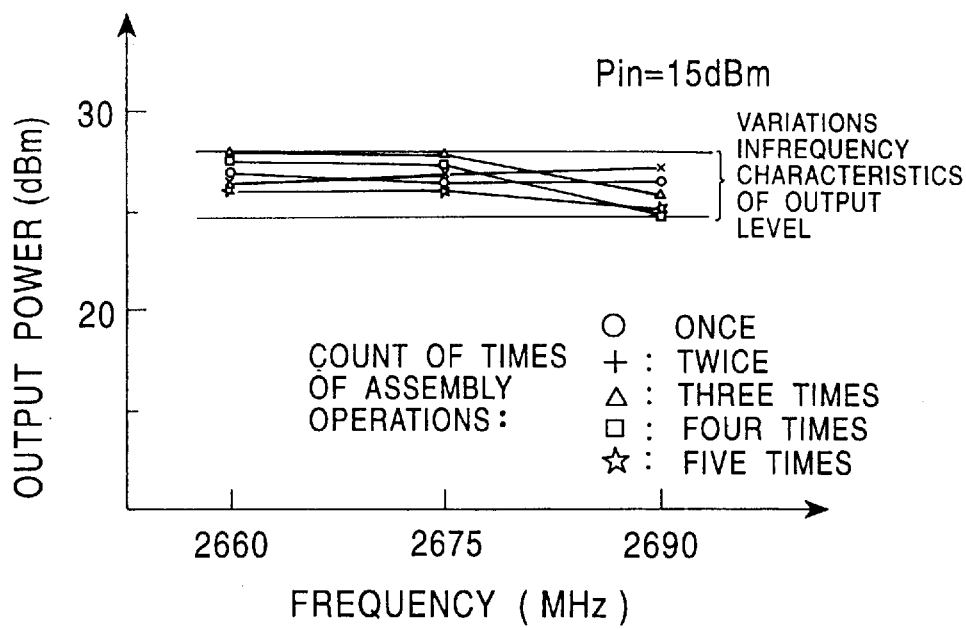
Figure 7D:
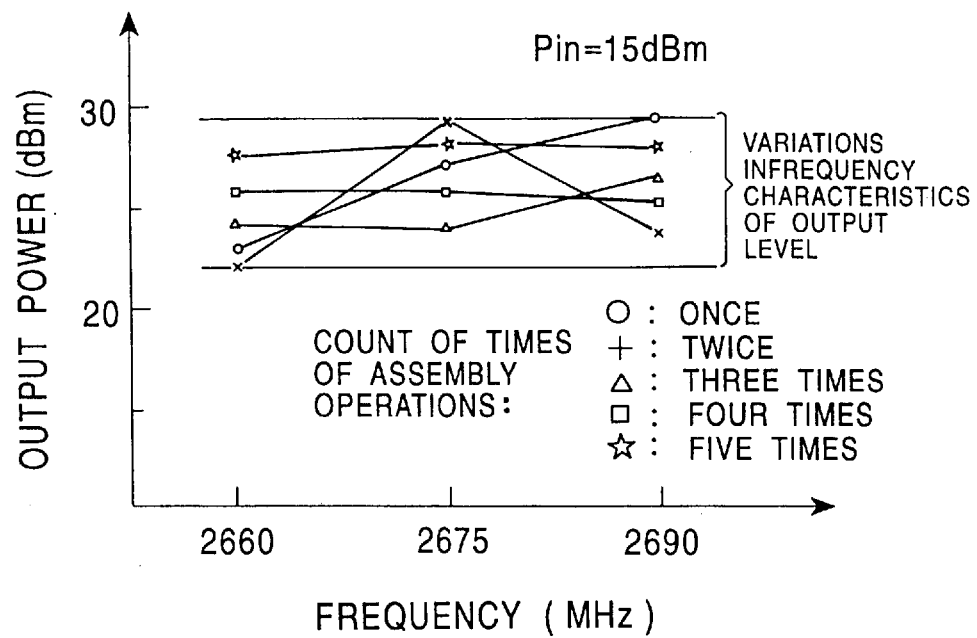

In FIG. 7D, the frequency characteristics of the output power level in a band with a constant input level of +15 dB are measured through reassembly of five times. FIG. 7C shows variations in frequency characteristics of the present invention through reassembly of five times. These variations in frequency characteristics reveal the effectiveness of the stability and reproducibility of the amplifier according to the present invention.

If the positions of the board attaching screws 28 near the transistor input and output matching circuits 10 and 20 are optimized, the count of screws can be reduced. As a result, the cost of material of the screws 28, the cost required for forming taps on the housing, the cost of forming screw holes in the first and second dielectric boards 6 and 17, and the count of assembly steps required by screw fastening can be reduced. The cost of the amplifier, the panel, and the apparatus including them can accordingly be reduced.

A high-frequency amplifier according to the second embodiment of the present invention will be described.

Figure 6A:
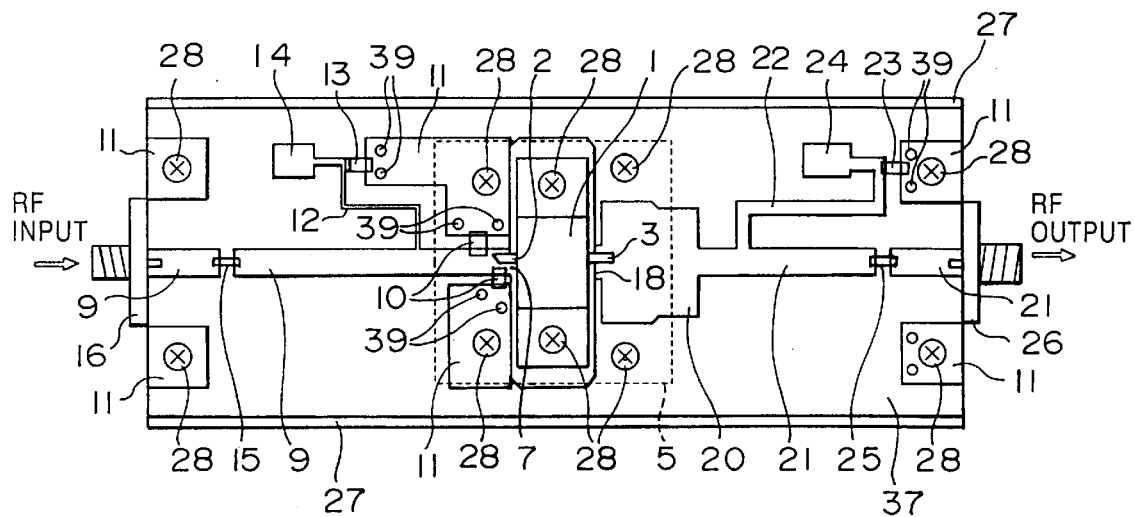
FIGS. 6A and 6B are a schematic plan view and a module view, respectively, showing the second embodiment of the present invention.
Figure 6B:
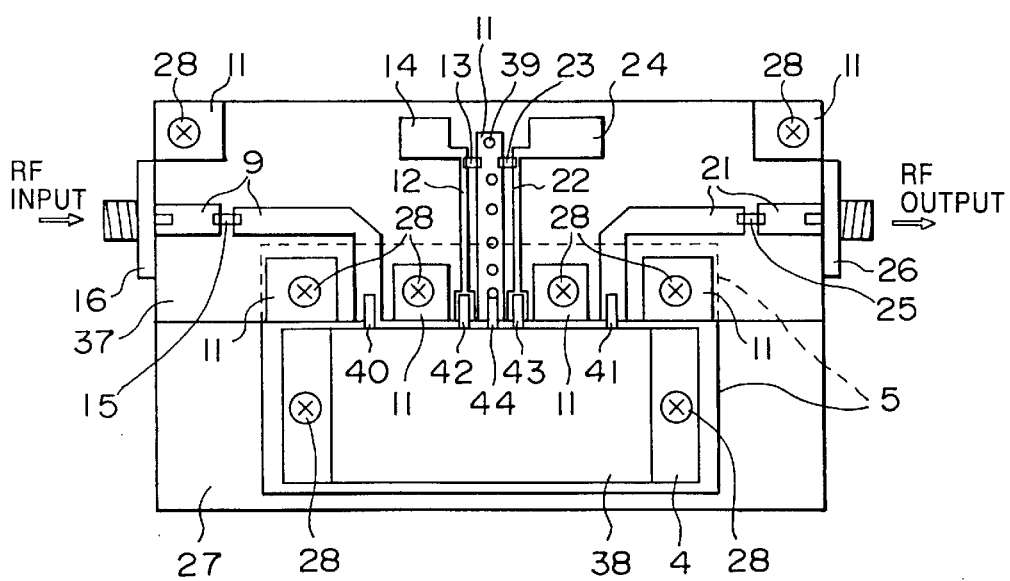

Referring to FIGS. 6A and 6B, in this embodiment, the constituent elements identical to those shown in FIGS. 4A and 4B are denoted by the same reference numerals as in FIGS. 4A and 4B.

In FIGS. 6A and 6B, as a thin film conductive sheet 5, for example, an indium sheet, a thin film copper plate, or a thin film aluminum plate can be used other than a solder sheet. Considering the board loss that occurs as the frequency increases to, e.g., several 10 GHz, a BT resin, alumina, or ceramic may be used as the material of a first or second dielectric board 6 or 17. As the material of a common ground surface member 27, a cast product made of a magnesium alloy may be used, other than aluminum, in order to reduce the weight.

In the first embodiment shown in FIGS. 4A and 4B, and FIG. 5, the first and second dielectric boards 6 and 17 are completely independent two boards. In the second embodiment, as shown in FIG. 6A, sometimes one board 37 (a glass-reinforced epoxy board, a Teflon/glass fiber board, a BT resin board, or an alumina/ceramic board) is used and a hole is formed around the transistor mounting position on the board 37 to define the outer shape of radiation fins 4, thus constituting an amplifier. In this case as well, one soft thin film conductive sheet 5 is inserted between a common ground surface member 27 and the board 37, and the lower surface of a transistor 1, such that it extends over the input/output portions. As a result, continuous electrical ground is maintained, and amplification operation can be stabilized.

As shown in FIG. 6B, a discrete transistor may be employed as a high-frequency module 38. In FIG. 6B, reference numeral 40 denotes an input terminal; 41; an output terminal; 42 and 43, voltage application terminals; and 44, a ground terminal.

If N (N is an integer equal to or larger than 2) amplifiers each according to the present invention are connected in series, the resultant assembly can be used as a multi-stage series amplifier. If N (N is an integer equal to or larger than 2) amplifiers each according to the present invention are connected in parallel with each other, the resultant assembly can be used as a multi-stage parallel amplifier. Furthermore, series connection and parallel connection may be combined to provide a multi-stage amplifier.

What I claim is:

1. In an amplifier comprising a transistor having a transistor input terminal, a transistor output terminal, and ground radiation fins, a first dielectric board having a transistor input matching circuit, and a second dielectric board having a transistor output matching circuit, said transistor being mounted on said ground radiation fins in tight contact with a common ground surface member, said first and second dielectric boards being mounted on said common ground surface member, said first and second dielectric boards being respectively formed with first and second ground conductors on common ground surface member sides thereof, and said transistor input terminal and said transistor input matching circuit being connected to each other and said transistor output terminal and said transistor output matching circuit being connected to each other, a high-frequency amplifier wherein a thin film conductive sheet is continuously inserted to extend from a gap between said first ground conductor and said common ground surface member to a gap between said second ground conductor and said common ground surface member through a gap between said first ground conductor and said common ground surface member, and said first dielectric board, said ground radiation fins, and said second dielectric boards are brought into tight contact with said common ground surface member via said thin film conductive sheet so as to press and fix said thin film conductive sheet between said first and second dielectric boards and said radiation fins, and said common ground surface member.

2. A high-frequency amplifier according to claim 1, wherein said transistor is an emitter- or base-grounded discrete bipolar transistor.

3. A high-frequency amplifier according to claim 1, wherein said transistor is a source-grounded discrete field effect transistor.

4. A high-frequency amplifier according to claim 1, wherein said first and second dielectric boards are integrally connected to each other.

5. A high-frequency amplifier according to claim 1, wherein said transistor input matching circuit and said transistor output matching circuit respectively have microstrip lines.

* * * * *